United States Patent [19]

Nishida et al.

[11] 4,344,153

[45] Aug. 10, 1982

[54] MAGNETIC BUBBLE MEMORY DEVICE AND METHOD OF FABRICATING THE SAME

[75] Inventors: Hideki Nishida, Tokyo; Hirozi Yamada; Hiroshi Umezaki, both of Hachioji; Yutaka Sugita, Tokorozawa; Norikazu Tsumita, Kodaira, all of Japan

[73] Assignee: Hitachi, Ltd., Tokyo, Japan

[21] Appl. No.: 29,933

[22] Filed: Apr. 13, 1979

[30] Foreign Application Priority Data

Apr. 14, 1978 [JP] Japan ................................ 53-43222

[51] Int. Cl.³ ........................................... G11C 19/08
[52] U.S. Cl. ........................................ 365/39; 365/32
[58] Field of Search ............................. 365/32, 33, 39

[56] References Cited

U.S. PATENT DOCUMENTS

| | | | |
|---|---|---|---|
| 4,001,793 | 1/1977 | Henry et al. | 365/32 |
| 4,172,758 | 10/1979 | Bailey et al. | 365/39 |
| 4,178,635 | 12/1979 | Rose | 365/19 |
| 4,187,553 | 2/1980 | Ahn et al. | 365/39 |
| 4,299,680 | 11/1981 | Fontana, Jr. | 365/39 |
| 4,305,137 | 12/1981 | Hiroshima et al. | 365/39 |

FOREIGN PATENT DOCUMENTS

| | | | |
|---|---|---|---|
| 54-136141 | 10/1979 | Japan | 365/39 |
| 54-149529 | 11/1979 | Japan | 365/39 |
| 55-45159 | 3/1980 | Japan | 365/39 |

OTHER PUBLICATIONS

AIP Conference Proceedings on Magnetism & Magnetic Materials—No. 24; Dec. 3-6, 1974, pp. 624-626.

*Primary Examiner*—James W. Moffitt
*Attorney, Agent, or Firm*—Craig and Antonelli

[57] ABSTRACT

A magnetic bubble memory device and a method of fabricating the device are disclosed in which a conductor pattern lies at least between a film for maintaining magnetic bubbles therein, and a soft magnetic material pattern. Further, the magnetic bubble memory device can be formed precisely without suffering from errors due to mask alignment, by employing a mask provided with a plurality of patterns which are different in transmittance.

10 Claims, 9 Drawing Figures

MAGNETIC BUBBLE MEMORY DEVICE AND METHOD OF FABRICATING THE SAME

The present invention relates to a magnetic bubble memory device for use in a magnetic storage device and the like, and to a method of fabricating the above device.

A magnetic bubble memory device has, in general, such a structure as shown in FIG. 1 of the accompanying drawings. (For the purpose of facilitating full understanding, there have been omitted in FIG. 1 some members, for example, wirings and a non-magnetic substrate which have no direct connection with the present invention.)

Referring to FIG. 1, there are stacked successively, in the order described, a magnetic film 1 which is epitaxially grown on a non-magnetic substrate (not shown) and can maintain therein magnetic bubbles, (a magnetic garnet monocrystalline film is generally used as the magnetic film 1), a spacer 2 made of an insulating material, for example, silicon dioxide, conductor patterns 3 which are used for the control of magnetic bubbles such as the generation or annihilation of magnetic bubbles, an insulating film 4 made of, for example, silicon dioxide, soft magnetic material patterns 5 and 5' which are used for the detection or transfer of magnetic bubbles, and a passivation film 6.

However, the following problems have been inherent in conventional magnetic bubble memory devices having such a structure as shown in FIG. 1. As is apparent from FIG. 1, the difference in level is produced in the soft magnetic material pattern 5 when a part of the soft magnetic material pattern 5 and the conductor pattern 3 overlap each other, and thus the soft magnetic material pattern 5 cannot be flat. This results in undesirable problems such as the lowering of operational margin of the magnetic bubble memory. Moreover, the adverse effect due to the aforementioned level difference becomes more remarkable when the diameter of the magnetic bubble is made smaller for the purpose of attaining a high density recording, which provides an obstruction to the reduction in size of the magnetic bubbles.

Further, the magnetic bubble memory structure such as shown in FIG. 1 requires both various kinds of films and repeated working of the films through photolithography. This results in very complicated fabricating process as well as the difficulty of the formation of such a structure with high precision.

An object of the present invention is to provide a magnetic bubble memory device having flat soft-magnetic-material patterns with no level difference to overcome the above problems inherent in the conventional magnetic bubble memory device.

Another object of the present invention is to provide a method of fabricating the above memory device.

The present invention will be apparent from the following detailed description taken in conjunction with the accompanying drawings, in which.

Figure 1:
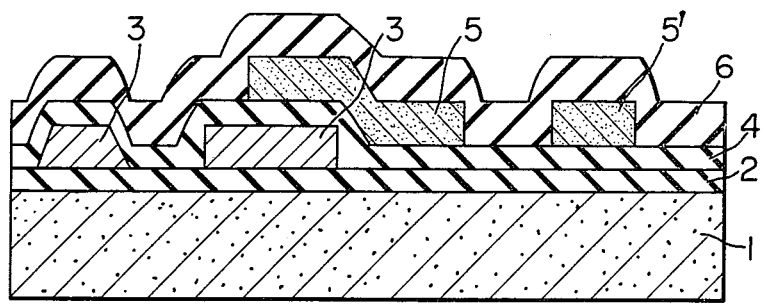
FIG. 1 is a sectional view of a conventional magnetic bubble memory device.
Figure 2:
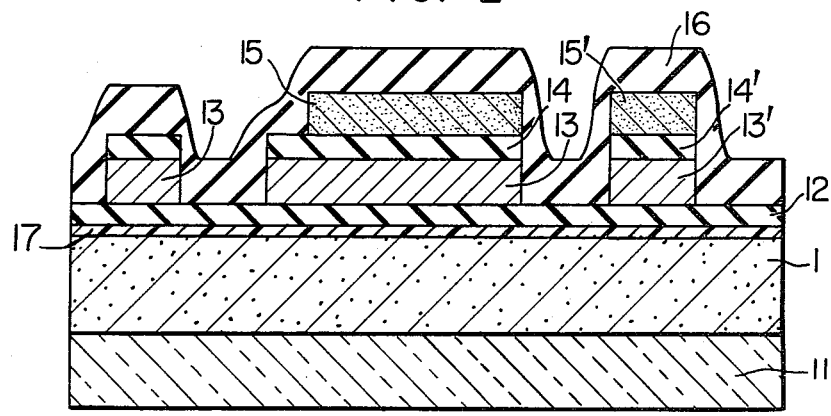
FIG. 2 is a sectional view of a magnetic bubble memory device according to an embodiment of the present invention.

FIG. 2 shows, in section, a magnetic bubble memory device according to an embodiment of the present invention which, like the conventional device shown in FIG. 1, has such a structure that a magnetic film 1, spacer 12, conductor patterns 13 and 13', insulating films 14 and 14', soft magnetic material patterns 15 and 15', and a passivation film 16 are stacked on a a non-magnetic monocrystalline substrate 11 made of gallium gadolium oxide or the like so as to form a laminate. However, it should be noted as seen from FIG. 2 that the conductor patterns 13 and 13' inevitably exist beneath the soft magnetic material patterns 15 and 15', and the insulating films 14 and 14' are interposed between the conductor pattern 13 and the soft magnetic material pattern 15 and between the pattern 13' and the pattern 15', respectively. Thus, according to the present invention, the soft magnetic patterns 15 and 15' are placed in one plane, and there is no fear of appearance of the level difference in the soft magnetic material patterns. As apparent from the comparison between FIGS. 1 and 2, in the conventional device, no conductor pattern 3 necessarily exists beneath magnetic material patterns 5 and 5'. This causes the level difference. On the other hand, according to the present invention, since the conductor patterns 13 and 13' inevitably exist beneath the soft magnetic material patterns 15 and 15', neither of the patterns 15 and 15' has any level difference and is flat.

In the present invention, only one pattern 13 of the conductor patterns 13 and 13' is used to control magnetic bubbles while the other pattern 13' has no concern with the control of magnetic bubbles and is used only to place the soft magnetic material pattern 15' on the same plane as the soft magnetic material pattern 15. Therefore, the operation of the magnetic bubble memory device is affected only a little by above structure in which any conductor patterns always exist entirely beneath all soft magnetic material patterns. As described above, in the present invention, only one conductor pattern 13 is used to control magnetic bubbles, and the other conductor pattern 13' has no concern with the control of magnetic bubbles. The conductor pattern used to control magnetic bubbles should have the property that the electric resistance thereof is low and electromigration is generated therein only with difficulty. Accordingly, the conductor pattern of this kind is generally made of aluminium or various kinds of aluminium alloys such as an aluminium-copper alloy. Further, it has been proposed to use gold, silver, copper and molybdenum as the conductor pattern. On the other hand, the conductor pattern having no concern with the control of magnetic bubbles may be made of any material, so long as it has the same thickness as the conductor pattern for controlling magnetic bubbles and so may not always be made of the same material as the pattern for controlling magnetic bubbles. Furthermore, since the pattern is a dummy conductor having no concern with the magnetic bubble control it is not supplied with any electric current, it may not always be a conductor. However, it is very preferable that the conductor pattern 13 for controlling magnetic bubbles and the conductor pattern 13' for preventing the level difference are both made of the same material, since both patterns 13 and 13' can be formed simultaneously.

Incidentally, the spacer 12 and the insulating films 14 and 14' are not always indispensable for the magnetic bubble memory device, and therefore magnetic bubble memory devices can be fabricated without employing both or either one of the spacer and the insulating film.

Additionally, a film 17 for suppressing hard bubbles, which is generally made of permalloy, is inserted between the magnetic film 1 for maintaining magnetic bubbles and the spacer 12 thereon in many cases.

Next, explanation will be made on a method of fabricating the aforementioned magnetic bubble memory device according to the present invention.

Figure 3A:
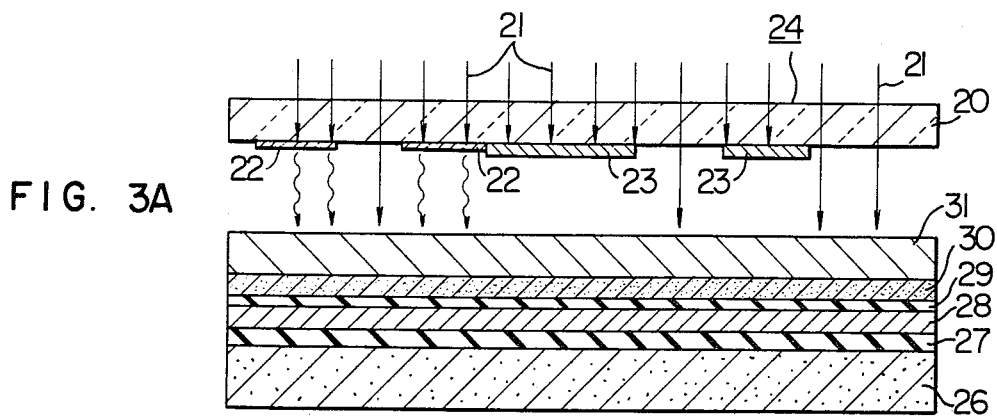
FIGS. 3A to 3D are sectional views for showing an example of a process of fabricating the magnetic bubble memory device shown in FIG. 2.

As shown in FIG. 3A, there are successively stacked on a non-magnetic substrate (not shown) in the order described, a magnetic film 26 capable of maintaining magnetic bubbles therein, a permalloy film (not shown) for suppressing hard bubbles, a spacer 27 made of silicon dioxide, a conductor layer 28 made of an aluminium-copper alloy, an insulating layer 29 made of silicon dioxide, and a soft magnetic material layer 30 made of permalloy. Further, a photoresist film 31 is applied all over the surface. The photoresist film 31 is illuminated with light 21 through a mask 24 in which semitransparent patterns 22 and opaque patterns 23 are provided on a transparent substrate 20. Thus, the photoresist film 31 is subjected to the irradiation of light in such a manner that the quantity of incident light is different on various portions of the photoresist film. In order to irradiate the photoresist film in such a manner, in addition to the aforementioned method, several other methods can be employed. For example, the intensity of light and the exposure time may be varied from portion to portion on the photoresist film, or the exposure may be repeated at desired portions.

The above method, which employs a mask provided with a plurality of patterns different in transmittance, has advantages that the operation can be performed rapidly because a single exposure is quite enough, and that there arises no error due to mask alignment and the desired working can be conducted with high precision because of the use of only a single mask. Thus, the above method is preferable from the practical point of view.

Figure 3B:
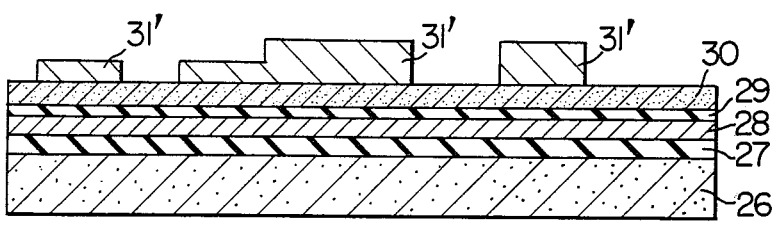
Figure 3C:
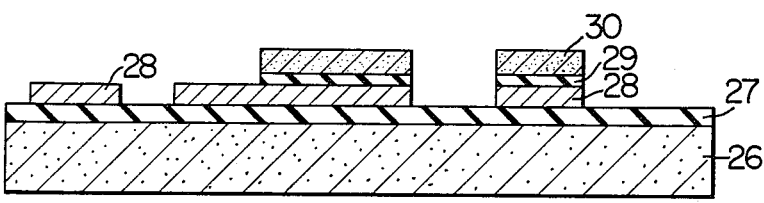
Figure 3D:
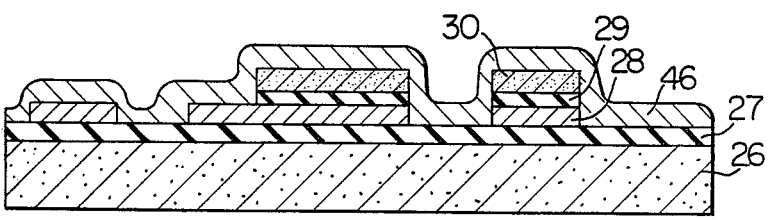

When the photoresist film 31 is illuminated with light through the mask 24, light is transmitted through that part of the mask which is not provided with the patterns 22 and 23. Accordingly, the photoresist film is subjected to remarkable photo-decomposition just under that part of the mask 24. On the other hand, since the pattern 23 is opaque as described above, the photoresist film just under the pattern 23 does not suffer from any photo-decomposition. Further, since the pattern 22 is semitransparent, the photoresist film just under the pattern 22 is illuminated with the light of an intermediate intensity, and is subjected to an intermediate photo-decomposition. That is, through the exposure of the photoresist film in a such manner as shown in FIG. 3A, a plurality of regions which are different in the degree of photo-decomposition from each other are formed in the photoresist film 31. A plurality of patterns 31' which are made of the photoresist films having different thicknesses are formed through the development of the exposed photoresist film as shown in FIG. 3B. Next, the layers 28, 29 and 30 are etched through well-known etching techniques such as ionmilling, while employing the patterns 31' as masks. Then, as shown in FIG. 3C, a plurality of patterns which include different kinds of layers are formed as shown in FIG. 3C. In more detail, since a region which is not coated with any pattern 31' is etched for a long time, all of the soft magnetic material layer 30, insulating layer 29 and conductor layer 28 are removed, and the surface of the spacer 27 is exposed. On the other hand, since it takes a lot of time for the thick portion of the pattern 31' to be removed, the layers 30, 29, and 28 just under the thick portion of the pattern 31' are left unetched. Further, since a region coated with the thin portion of the pattern 31' is etched after the above thin portion has been removed, only both the soft magnetic material layer 30 and the insulating layer 29 are removed, and the conductor layer 28 is left unetched. Next, an insulating film 46 for passivation is applied all over the surface. Thus, the device such a structure as shown in FIG. 3D can be obtained. It is needless to say that the structure shown in FIG. 3D is entirely the same as that shown in FIG. 2.

Besides visible rays and ultraviolet rays, X-rays and an electron beam can be used to irradiate the resist film. In these cases, an X-ray resist and an electron beam resist are used as the resist, and an X-ray mask and an electron beam mask are used as the mask. Further, since the mask used in the present invention should include a plurality of patterns having different transmittances in such a manner that these patterns are correctly and precisely arranged in desired positions, it is most preferable from the practical point of view to form the mask through electron beam exposure techniques.

Next, explanation will be made on an embodiment of a method of fabricating a magnetic bubble memory device according to the present invention.

Figure 4:
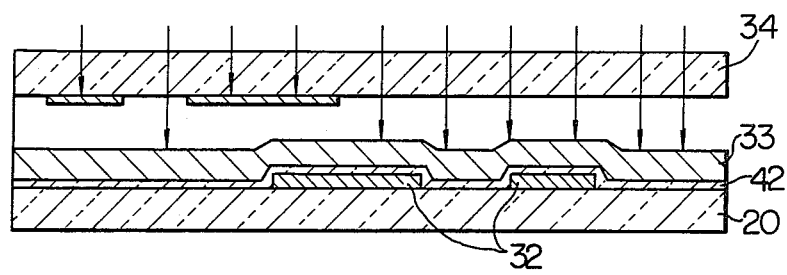
FIGS. 4 and 5 are sectional views for explaining different methods of fabricating masks used in the present invention, respectively.
Figure 5:
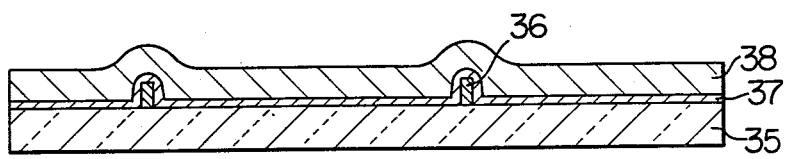

In the present invention, the photoresist film is illuminated with light through the mask having a plurality of patterns which are different in transmittance from each other. The above mask can be made through photoetching techniques, for example, in the following manner. As shown in FIG. 4, chromium patterns 32 made of a chromium film are formed on a transparent substrate 20 through well-known techniques and then, a permalloy film 42 having a thickness of about 70 Å and a photoresist film 33 (for example, AZ 1350 manufactured by Shipley Co.) are successively applied. After having been illuminated with light through a photomask 34, the photoresist film 33 is developed to remove regions having a high solubility. Exposed portions of the permalloy film 32 are etched away by an aqueous solution of phosphoric acid-nitric acid system, and then the remaining photoresist film is removed. Thus, the mask 24 provided with a plurality of patterns having different transmittances such as shown in FIG. 3A is formed since the permalloy film is semitransparent and the chromium film is opaque. The above mask can also be formed through electron beam lithography in the following manner. As shown in FIG. 5, gold reference markers 36 are formed at desired positions on a glass plate 35 through photolithography, and further a chromium film 37 having a thickness of about 80 Å and an electron beam resist film 38 are successively provided all over the surface. The electron beam resist film 38 and the chromium film 37 are treated through well-known electron beam lithographic techniques, so that chromium patterns for use in making the previously-mentioned soft magnetic material patterns are formed in predetermined positions with respect to the reference markers 36. Permalloy patterns which are used in making the conductor patterns can also be formed in a similar manner. In the foregoing, various embodiments of the method of fabricating the mask which is used in the present invention have been described. Now, let us return to the embodiment of the method of fabricating a magnetic bubble memory device according to the present invention.

Referring to FIGS. 3A to 3D there are stacked on a magnetic garnet film 26 which is deposited on a non-magnetic monocrystalline substrate (not shown) and can maintain magnetic bubbles therein, a permalloy film 70 Å (not shown) thick for suppressing hard bubbles, a silicon oxide film 27 4000 Å thick, an aluminium-copper alloy film 28 4000 Å thick, a silicon dioxide film 30 3000 Å and a permalloy film 3500 Å thick, so as to form a laminate. A photoresist 31 (AZ 1350 J manufactured by Shipley Co.) film having a thickness of 1.3 μm is applied all over the surface, and is illuminated with light through a mask, which has been fabricated in the aforementioned methods, for ten minutes by the mask aligner manufactured by Kasper Co. The photoresist film is developed by the 50% solution of AZ 1350 (trade name) developer to form resist patterns. The resist patterns 31' thus obtained are 0.5 μm and 1.2 μm thick at respective portions corresponding to the conductor pattern and the soft magnetic material pattern. Then, the ionmilling is conducted until the aluminium-copper alloy film 28 is removed at the portions where no resist film is left behind and the surface of the permalloy film is exposed. The above ionmilling is effected by the "microetch system" manufactured by Veeco Co. under the following conditions: an accelerating voltage of 600 V, an argon pressure of $5 \times 10^{-5}$ Torr, an ion current density of 0.5 mA/cm$^2$, and an incident angle of ion beam of 30°. The magnetic bubble memory device of such a structure as shown in FIG. 3C is obtained through the ionmilling which is effected for 20 minutes under the aforementioned conditions.

As described above, the mask used in the present invention is provided with a plurality of patterns which are different in transmittance for radiation used in exposure such as light rays, an electron beam and X-rays. The pattern which is opaque for the light rays can be made of many materials such as chromium and iron oxide. In addition to the above permalloy film, a photoresist film, which is implanted with ions, can also be employed as a semitransparent pattern. Such a photoresist pattern utilizes the fact that the transmittance of the photoresist film depends upon the quantity of ions which are implanted into the film, and provides desired transmittance with high accuracy. Further, the photoresist pattern is used as the master pattern as it is, which permits the precise etching of the soft magnetic material film and the like and the simple relevant process.

Figure 6:
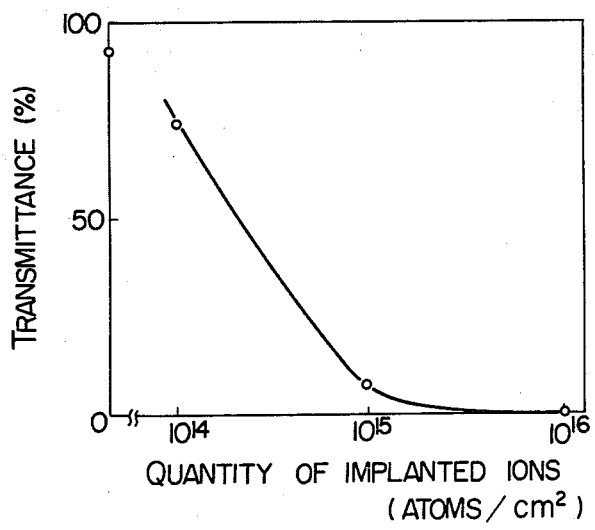
FIG. 6 is a graph showing a relationship between the quantity of ions implanted in a resist film and the light transmittance of the resist film.

FIG. 6 shows a relationship between the quantity of implanted ions and the transmittance in case where ions are implanted with an accelerating voltage of 120 KeV into a photoresist (AZ 1350 J) film having a thickness of 0.4 μm. It is evident from FIG. 6 that the transmittance of the photoresist film can be precisely controlled by the quantity of implanted ions.

As is apparent from the foregoing description, the present invention has the following advantages.

(1) Since the soft magnetic material patterns are all formed on entirely the same plane and have no difference in level, the magnetic bubble memory device according to the present invention has a very excellent characteristic.

(2) Since the fundamental structure of the magnetic bubble memory device can be made with a single exposure, repeated mask alignment is not required, and moreover the generation of error due to mask alignment is prevented. Thus, the magnetic bubble memory device can be fabricated with high accuracy.

What is claimed is:

1. A magnetic bubble memory device comprising a non-magnetic monocrystalline substrate, a magnetic film capable of maintaining magnetic bubbles therein, a conductor pattern for bubble control, a dummy conductor pattern, and soft magnetic material patterns, wherein said conductor patterns lie at least between said magnetic film and said soft magnetic material and wherein the entirety of said soft magnetic material patterns overlie at least portions of said conductor patterns so as to be maintained in one plane thereby.

2. A magnetic bubble memory device according to claim 1, wherein an insulating film is interposed between said magnetic film and said conductor pattern.

3. A magnetic bubble memory device according to claim 1 or 2, wherein an insulating film is interposed between said conductor pattern and said soft magnetic material pattern.

4. A magnetic bubble memory device according to claim 1 or 2, wherein said conductor pattern is made of a material selected from a group consisting of aluminium, aluminium alloys, gold, silver, copper, and molybdenum.

5. A magnetic bubble memory device according to claim 1 or 2, wherein said soft magnetic material pattern is made of permalloy.

6. A magnetic bubble memory device according to claim 1 or 2, wherein a surface of said non-magnetic substrate is coated with a magnetic film for suppressing hard bubbles.

7. A magnetic bubble memory device according to claim 6, wherein said magnetic film for suppressing hard bubbles is made of permalloy.

8. A magnetic bubble memory device according to claim 3, wherein said conductor pattern is made of a material selected from a group consisting of aluminum, aluminum alloys, gold, silver, copper, and molybdenum.

9. A magnetic bubble memory device according to claim 3, wherein said soft magnetic material pattern is made of permalloy.

10. A magnetic bubble memory device according to claim 3, wherein a surface of said non-magnetic substrate is coated with a magnetic film for suppressing hard bubbles.

* * * * *